US011476178B2

United States Patent
Altman et al.

(10) Patent No.: US 11,476,178 B2
(45) Date of Patent: Oct. 18, 2022

(54) SELECTIVELY-PLIABLE CHEMICAL VAPOR DEPOSITION (CVD) DIAMOND OR OTHER HEAT SPREADER

(71) Applicant: Raytheon Company, Waltham, MA (US)

(72) Inventors: David H. Altman, Sudbury, MA (US); Susan C. Trulli, Lexington, MA (US); Avram Bar-Cohen, Bethesda, MD (US)

(73) Assignee: Raytheon Company, Waltham, MA (US)

( * ) Notice: Subject to any disclaimer, the term of this patent is extended or adjusted under 35 U.S.C. 154(b) by 47 days.

(21) Appl. No.: 16/901,922

(22) Filed: Jun. 15, 2020

(65) Prior Publication Data

US 2021/0028083 A1    Jan. 28, 2021

Related U.S. Application Data

(60) Provisional application No. 62/877,248, filed on Jul. 22, 2019.

(51) Int. Cl.
*H01L 23/367* (2006.01)
*H01L 21/48* (2006.01)
*H01L 23/373* (2006.01)

(52) U.S. Cl.
CPC ........ *H01L 23/367* (2013.01); *H01L 21/4882* (2013.01); *H01L 23/3677* (2013.01);
(Continued)

(58) Field of Classification Search
CPC ............. H01L 21/4882; H01L 21/4871; H01L 23/367; H01L 23/3732; H01L 23/3735;
(Continued)

(56) References Cited

U.S. PATENT DOCUMENTS 5,635,258 A * 6/1997 Chen ..................... C23C 16/274
                                                   427/249.11
6,031,285 A   2/2000 Nishibayashi
(Continued)

FOREIGN PATENT DOCUMENTS

DE   10 2013 212469 A1   12/2014
DE   10 2016 213523 A1    2/2017
TW      201 015 750 A     4/2010

OTHER PUBLICATIONS

Obeloer et al., "CVD Diamond Manages Device Heat Effectively", mwrf.com, Apr. 2017, 29 pages.
(Continued)

*Primary Examiner* — Andres Munoz

(57) ABSTRACT

A system includes at least one component configured to generate thermal energy, a heat spreader configured to remove thermal energy from the at least one component, and at least one substrate configured to remove thermal energy from the heat spreader. The heat spreader includes a first portion and a second portion. The first portion of the heat spreader is coupled to the substrate, and the second portion of the heat spreader is coupled to the at least one component. The first portion of the heat spreader includes high aspect-ratio structures that are separated from one another. The high aspect-ratio structures cause the first portion of the heat spreader to be pliable and able to accommodate a mismatch in coefficients of thermal expansion between a material in the heat spreader and a material in the substrate.

20 Claims, 3 Drawing Sheets

(52) U.S. Cl.
CPC ...... *H01L 23/3732* (2013.01); *H01L 23/3735* (2013.01); *H01L 23/3672* (2013.01)

(58) Field of Classification Search
CPC .. H01L 23/42; H01L 23/3672; H01L 23/3677
See application file for complete search history.

(56) References Cited

U.S. PATENT DOCUMENTS

| | | |
|---|---|---|
| 6,858,080 B2 | 2/2005 | Linares et al. |
| 7,355,855 B2* | 4/2008 | Karidis ................ H01L 23/433 257/E23.09 |
| 8,809,820 B2 | 8/2014 | Dahm |
| 9,214,407 B2 | 12/2015 | Twitchen |
| 9,496,197 B1 | 11/2016 | Micovic et al. |
| 10,366,936 B2 | 7/2019 | Ellis |
| 2002/0130407 A1* | 9/2002 | Dahl ........................ C07C 7/04 257/712 |
| 2003/0183368 A1* | 10/2003 | Paradis ................... H01L 24/32 257/E23.098 |
| 2005/0070048 A1 | 3/2005 | Tolchinsky et al. |
| 2008/0019098 A1 | 1/2008 | Sung |
| 2008/0029883 A1 | 2/2008 | Sung |
| 2010/0085713 A1 | 4/2010 | Balandin et al. |

OTHER PUBLICATIONS

"CVD Diamond: The Ultimate Semiconductor Thermal Management Solution", Element Six, May 2019, 2 pages.
"The Element Six CVD Diamond Handbook", Element Six, 2018, 28 pages.
"The Highest Thermal Conductivity Material is now also Electrically Conductive", Element Six, Jun. 2017, 2 pages.
"CVD Diamond Delivers a Cool Competitive Advantage", Element Six, Jan. 2019, 4 pages.
Obeloer et al., "Optimizing Diamond Heat Spreaders for Thermal Management of Hotspots for GaN Devices", 2015, 6 pages.
International Search Report dated Sep. 22, 2020 in connection with International Patent Application No. PCT/US2020/037953, 3 pages.
Written Opinion of the International Searching Authority dated Sep. 22, 2020 in connection with International Patent Application No. PCT/US2020/037953, 6 pages.

* cited by examiner

SELECTIVELY-PLIABLE CHEMICAL VAPOR DEPOSITION (CVD) DIAMOND OR OTHER HEAT SPREADER

CROSS-REFERENCE TO RELATED APPLICATION AND PRIORITY CLAIM

This application claims priority under 35 U.S.C. § 119(e) to U.S. Provisional Patent Application No. 62/877,248 filed on Jul. 22, 2019, which is hereby incorporated by reference in its entirety.

TECHNICAL FIELD

This disclosure generally relates to heat spreaders for integrated circuit devices or other devices. More specifically, this disclosure relates to a selectively-pliable chemical vapor deposition (CVD) diamond or other heat spreader.

BACKGROUND

Heat spreaders are routinely used in electronic devices to remove thermal energy from components of those devices, such as from power amplifiers or other integrated circuit chips. In high-power systems, diamond-based heat spreaders formed using chemical vapor deposition (CVD) have been used to remove heat from integrated circuit chips, such as gallium nitride (GaN) on silicon carbide (SiC) power amplifiers or other high thermal dissipation density devices. These types of devices often require highly-effective and thermal expansion-matched heat spreading in order to adequately and reliably manage operating temperatures of the devices. Unfortunately, high-quality CVD diamond is typically relatively expensive to manufacture and has a low coefficient of thermal expansion (CTE), meaning the CVD diamond does not expand much as temperatures increase. As a result, this makes CVD diamond heat spreaders generally incompatible with packaging technologies that require higher CTEs or that are cost-sensitive.

SUMMARY

This disclosure provides a selectively-pliable chemical vapor deposition (CVD) diamond or other heat spreader.

In a first embodiment, an apparatus includes a heat spreader that includes a first portion and a second portion. The first portion of the heat spreader is configured to be coupled to a substrate, and the second portion of the heat spreader is configured to be coupled to at least one device to be cooled. The first portion of the heat spreader includes high aspect-ratio structures that are separated from one another. The high aspect-ratio structures cause the first portion of the heat spreader to be pliable and able to accommodate a mismatch in coefficients of thermal expansion between a material in the heat spreader and a material in the substrate.

In a second embodiment, a system includes at least one component configured to generate thermal energy, a heat spreader configured to remove thermal energy from the at least one component, and at least one substrate configured to remove thermal energy from the heat spreader. The heat spreader includes a first portion and a second portion. The first portion of the heat spreader is coupled to the substrate, and the second portion of the heat spreader is coupled to the at least one component. The first portion of the heat spreader includes high aspect-ratio structures that are separated from one another. The high aspect-ratio structures cause the first portion of the heat spreader to be pliable and able to accommodate a mismatch in coefficients of thermal expansion between a material in the heat spreader and a material in the substrate.

In a third embodiment, a method includes obtaining a heat spreader that includes a first portion and a second portion, attaching the first portion of the heat spreader to a substrate, and attaching the second portion of the heat spreader to at least one device to be cooled. The first portion of the heat spreader includes high aspect-ratio structures that are separated from one another. The high aspect-ratio structures cause the first portion of the heat spreader to be pliable and able to accommodate a mismatch in coefficients of thermal expansion between a material in the heat spreader and a material in the substrate.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
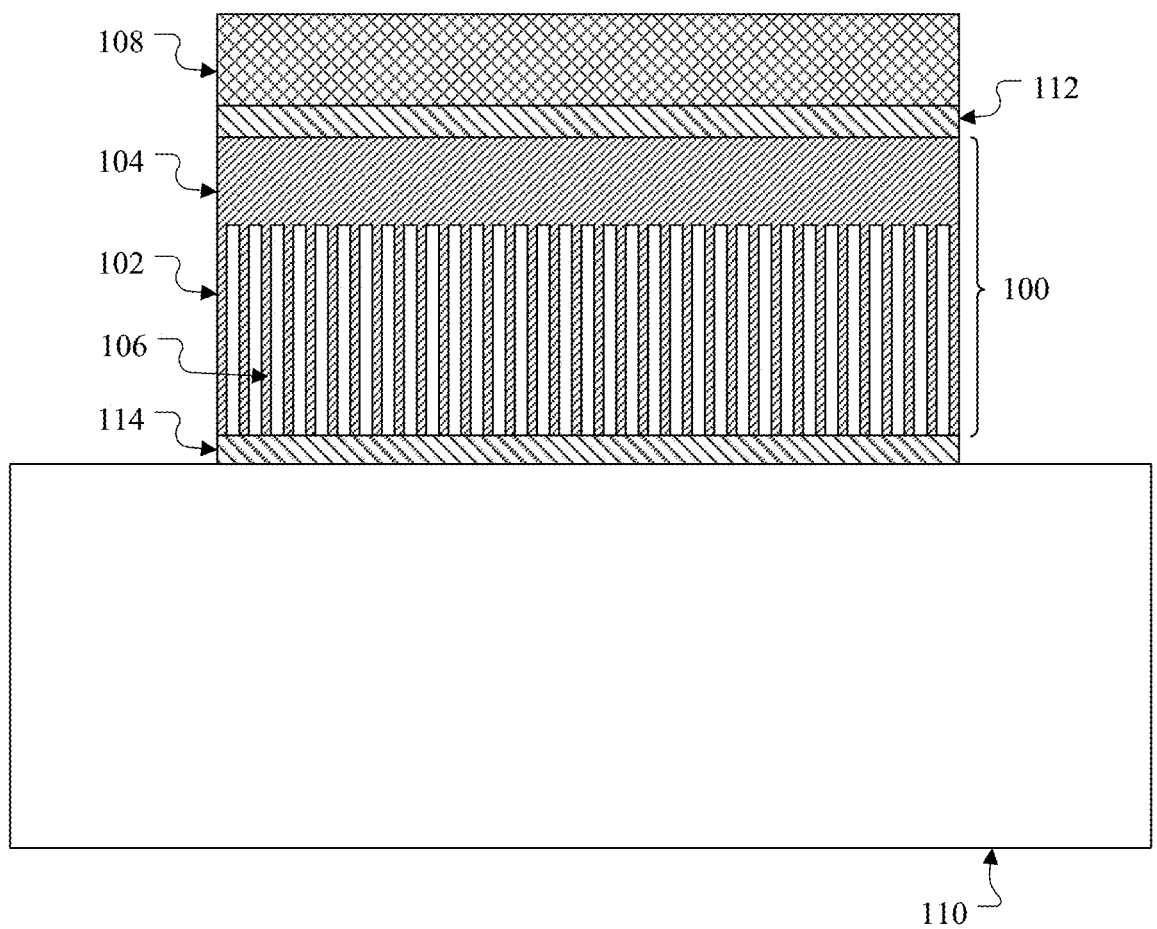
FIG. 1 illustrates an example selectively-pliable chemical vapor deposition (CVD) diamond or other heat spreader in accordance with this disclosure.

FIGS. 1 through 4, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, diamond-based heat spreaders formed using chemical vapor deposition (CVD) can be used to remove heat from integrated circuit chips, such as from gallium nitride (GaN) on silicon carbide (SiC) power amplifiers or other devices. Unfortunately, high-quality CVD diamond is typically relatively expensive to manufacture and has a low coefficient of thermal expansion (CTE), which makes CVD diamond heat spreaders generally incompatible with certain packaging technologies that require higher CTEs or that are cost-sensitive. For example, low-cost radio frequency (RF) modules and other components often need lower-cost heat spreaders in order to control the costs of the components. Also, RF modules and other components are often mounted on copper substrates or other substrates that have higher coefficients thermal of expansion compared to CVD diamond, meaning those substrates expand at a faster rate than the CVD diamond as temperatures increase. This can create large amounts of stress that need to be managed at the interface between the CVD diamond heat spreaders and the associated package substrates. Typically, the materials used to manage the thermal stress compromise the thermal benefit of the diamond due to their poorer thermal conductivity.

CVD diamond fabricators have developed various materials in an attempt to provide a compromise between thermal conductivity, cost, and CTE and find a "sweet spot" between lower-cost materials (such as beryllium oxide) and pure polycrystalline CVD diamond. These attempts have largely focused on metal/diamond composites, such as aluminum-diamond, copper-diamond, and silver-diamond materials and other more-exotic diamond composites. Also, methods to "grade" the thermal conductivity across the thickness of the heat spreader by varying the quality of CVD diamond during fabrication so as to optimize performance and cost have been proposed. However, these attempts have not shown an ability to grade the CTE and, as a result, continue to produce CVD diamond having a low CTE.

This disclosure provides various selectively-pliable diamond heat spreaders or other heat spreaders for use in high-power applications or other applications, where the heat spreaders achieve a combination of tailored pliability, high thermal performance, and low cost. As described in more detail below, in some embodiments, a boron-doped CVD diamond material or other diamond material (such as a wafer) is fabricated or otherwise obtained, and mechanically-pliable pillar structures or other high aspect-ratio structures are formed in one major surface of the diamond material. The presence of these high aspect-ratio structures makes this surface of the diamond material highly pliable, so this surface can be joined to another structure (such as a copper or other substrate) having a higher CTE. Because this surface of the diamond material is pliable due to the presence of the high aspect-ratio structures, it can accommodate expansions and contractions of the diamond material and the copper or other substrate that occur at different rates. As a result, this surface of the diamond material can reduce stresses that would otherwise be elevated by the differing expansions and contractions of the diamond material and the copper or other substrate caused by their CTE mismatches.

The other major surface of the diamond material may remain unetched or otherwise solid. This allows that surface to maintain a higher stiffness and higher thermal conductivity in areas where the diamond material is attached to one or more low-CTE integrated circuit chips or other devices to be cooled, such as when coupled to a silicon (Si), silicon carbide, or other substrate(s) of the device(s). As a result, the fully-dense high-conductivity diamond is placed closest to the device(s) to be cooled where that material is needed most, while the pliable surface having the high aspect-ratio structures is located on the opposing side where CTE mismatch needs to be addressed.

In some instances, the use of boron-doped diamond material helps to control or reduce costs since boron-doped CVD diamond can be grown notably faster than even the lowest grade of pure CVD diamond and can be substantially easier to etch. Note that if multiple instances of the heat spreader are formed on the same wafer, the wafer can be cut or otherwise processed to separate the heat spreaders after fabrication, which can also simplify manufacturing operations and increase manufacturing yields.

These approaches can provide various benefits or advantages depending on the implementation. For example, a heat spreader formed using one of these approaches provides high thermal performance because the thermal conductivity of boron-doped diamond or other diamond material is very high, such as between 800 W/m·K and 2000 W/m·K or more. Also, the selective pliability of the CVD diamond material on the etched side of the heat spreader enables the use of a thin, low thermal resistance die-attach material to the unetched portion of the diamond material, such as a thin film of solder. In addition, the use of a boron-doped diamond heat spreader or other diamond heat spreader helps to create opportunities to reduce spreader metallization costs, since boron-doped diamond or other diamond material provides a degree of electrical conductivity that may alleviate reliance on wrap-around metallization for direct current (DC) and RF grounding.

FIG. 1 illustrates an example selectively-pliable CVD diamond or other heat spreader 100 in accordance with this disclosure. As shown in FIG. 1, the heat spreader 100 includes a first portion 102 and a second portion 104. The first portion 102 of the heat spreader 100 defines a first major surface of the heat spreader 100 (located along the bottom of the heat spreader 100 in FIG. 1). The second portion 104 of the heat spreader 100 defines a second major surface of the heat spreader 100 (located along the top of the heat spreader 100 in FIG. 1) opposite the first major surface. The first portion 102 of the heat spreader 100 generally represents a portion of the heat spreader 100 that has been etched or otherwise processed to form separated pillars or other high aspect-ratio structures 106. The second portion 104 of the heat spreader 100 generally represents a portion of the heat spreader 100 that is generally unetched or otherwise solid and that is used to couple the heat spreader 100 to one or more devices to be cooled.

At least the first portion 102 of the heat spreader 100 is formed using CVD diamond. In some instances, the CVD diamond forming at least the first portion 102 of the heat spreader 100 can represent doped CVD diamond, such as boron-doped CVD polycrystalline diamond. In some embodiments, the doping of the first portion 102 of the heat spreader 100 is generally or substantially constant throughout. In other embodiments, the doping of the first portion 102 of the heat spreader 100 has a gradient, such as when the amount of dopant is greatest at the bottom of the first portion 102 of the heat spreader 100 and decreases moving upward (in the orientation shown in FIG. 1). Such a gradient may facilitate easier etching of the first portion 102 of the heat spreader 100 and/or result in a gradient in the thermal conductivity of the first portion 102 of the heat spreader 100. The doping gradient may be produced in any suitable manner, such as by varying the rate of growth and consequently the grain size and orientation of the polycrystalline diamond. In still other embodiments, the first portion 102 of the heat spreader 100 may be undoped CVD diamond.

The second portion 104 of the heat spreader 100 is formed using diamond, such as CVD polycrystalline diamond, and may or may not include any dopant. In some cases, the first and second portions 104 of the heat spreader 100 may initially be formed as a single integral piece of CVD diamond, and the integral piece of CVD diamond can then be etched or otherwise processed to form the high aspect-ratio structures 106 (thereby distinguishing the first and second portions 104 of the heat spreader 100). For example, in some embodiments, the heat spreader 100 can be fabricated using a CVD technique in which the first portion 102 of the heat spreader 100 is grown using a dopant (possibly in a gradient fashion) and then the second portion 104 of the heat spreader 100 is grown without using a dopant. Of course, the reverse can also occur, where the second portion 104 of the heat spreader 100 is grown without using a dopant and then the first portion 102 of the heat spreader 100 is grown using a dopant (possibly in a gradient fashion). Once grown or otherwise formed, the first and second portions 104 of the heat spreader 100 can be processed as needed, and the first portion 102 of the heat spreader 100 can be etched or otherwise processed to form the high aspect-ratio structures 106.

The two portions 102, 104 of the heat spreader 100 and the heat spreader 100 itself may each have any suitable size, shape, and dimensions. In this example, the heat spreader 100 is generally rectangular when viewed from the side, and the heat spreader 100 may be generally rectangular when viewed from the top. However, this is for illustration only, and any other suitable regular or irregular shapes may be used here. Also, in this example, the first portion 102 of the heat spreader 100 has a thickness (measured up-and-down in FIG. 1) that is larger, and possibly much larger, than a thickness of the second portion 104 of the heat spreader 100. Again, this is for illustration only, and each portion 102, 104 of the heat spreader 100 can have any suitable thickness. In addition, in this example, each portion 102, 104 of the heat spreader 100 has a substantially constant thickness, although this need not be the case. For instance, the high aspect-ratio structures 106 in different areas of the first portion 102 of the heat spreader 100 may have different heights.

The high aspect-ratio structures 106 in the heat spreader 100 generally represent pillars or other elongated structures having a high aspect-ratio, where those structures are separated from one another by gaps. A high aspect-ratio generally indicates that each structure 106 has a substantially larger height (measured up-and-down in FIG. 1) compared to its width (measured left-to-right in FIG. 1). The high aspect-ratio structures 106 in the heat spreader 100 can each have any suitable size, shape, and dimensions, and the high aspect-ratio structures 106 can have any suitable regular or irregular arrangement in the heat spreader 100. Each of the high aspect-ratio structures 106 can also have any suitable cross-sectional shape, such as a circular, rectangular, or other shape, and different high aspect-ratio structures 106 may or may not have different cross-sectional shapes.

The high aspect-ratio structures 106 can be formed in any suitable manner. Example techniques can include etching the diamond material forming the first portion 102 of the heat spreader 100 using a deep reactive ion etch (DRIE) process or other plasma etching process, a water jet etching process, or any other suitable process that removes material from the first portion 102 of the heat spreader 100 to form the high aspect-ratio structures 106. As noted above, in some embodiments, a doping gradient may be used in the first portion 102 of the heat spreader 100 in order to facilitate easier etching of the first portion 102 of the heat spreader 100. However, the use of a doping gradient (at least to facilitate etching) is optional and need not be used in a particular implementation of the heat spreader 100.

In this example, the heat spreader 100 is used to transfer thermal energy from one or more devices 108 to at least one substrate 110. Each device 108 represents any suitable integrated circuit chip or other structure that generates (or receives from another source) thermal energy to be removed by the heat spreader 100. In some embodiments, at least one device 108 represents one or more gallium nitride-on-silicon carbide integrated circuit chips or other high-power integrated circuit chips. As particular examples, at least one device 108 may include one or more power amplifiers or one or more RF modules. Note that while the one or more devices 108 are shown here as extending completely across the width of the second portion 104 of the heat spreader 100, this is for illustration only. The major surface of the heat spreader 100 formed by the second portion 104 of the heat spreader 100 may be larger (and possibly significantly larger) than the one or more devices 108 to be cooled.

Each substrate 110 represents any suitable structure that receives thermal energy from the heat spreader 100 and transports the thermal energy to one or more desired destinations (such as for removal). In some embodiments, each substrate 110 represents a copper substrate or other metallic or highly-thermally conductive substrate having a high CTE. In many instances, the CTE of the material(s) forming each substrate 110 will be higher than the CTE of the material(s) forming the heat spreader 100. As a result, each substrate 110 will expand and contract more relative to the heat spreader 100 over the same temperature changes. Note that the relative sizes and dimensions of the heat spreader 100 relative to the substrate 110 are for illustration only here and can vary as needed or desired.

A thermal interface material (TIM) 112 may be positioned between the heat spreader 100 and each device 108, and a thermal interface material 114 may be positioned between the heat spreader 100 and each substrate 110. Each thermal interface material 112, 114 generally represents a thin layer of material that facilitates the transfer of thermal energy between components and that provides protection to at least one of the components (such as the heat spreader 100). Each thermal interface material 112, 114 can be formed from any suitable material(s) and in any suitable manner. As particular examples, each thermal interface material 112, 114 may be formed using solder or a sintered material. Each thermal interface material 112, 114 may also have any suitable size, shape, and dimensions. Note that the thicknesses of the thermal interface materials 112, 114 are for illustration only and that the thermal interface materials 112, 114 may typically be much thinner than illustrated here.

As described above, the formation of the high aspect-ratio structures 106 allows the first portion 102 of the heat spreader 100 to be made selectively pliable. Among other things, this pliability allows the heat spreader 100 to be used with at least one substrate 110 having a different (and possibly a significantly different) coefficient of thermal expansion compared to the diamond material of the heat spreader 100. For example, CVD diamond in the heat spreader 100 may have a CTE of about 1 ppm/K, while copper in the substrate 110 may have a CTE of about 17 ppm/K. The use of the high aspect-ratio structures 106 allows the first portion 102 of the heat spreader 100 to accommodate such a large mismatch between the CTEs of the CVD diamond and the copper. In other words, since the high aspect-ratio structures 106 are pliable and can therefore bend to some extent as needed, the high aspect-ratio structures 106 may allow the material of the substrate(s) 110 to expand and contract at a significantly different rate compared to the material of the heat spreader 100.

Moreover, the tailorable nature of the high aspect-ratio structures 106 allows the amount of accommodation to be tailored in different ways for different implementations. Thus, for instance, different configurations or arrangements of high aspect-ratio structures 106 can be used to provide different amounts of pliability. These different configurations or arrangements of high aspect-ratio structures 106 can be used in different areas of the same first portion 102 of the same heat spreader 100 or in different heat spreaders 100. As particular examples, thicker high aspect-ratio structures 106 and/or more numerous high aspect-ratio structures 106 may provide less pliability, while thinner high aspect-ratio structures 106 and/or fewer high aspect-ratio structures 106 may provide more pliability. As a result, the desired amount of pliability in one or more areas of the first portion 102 of a heat spreader 100 can be obtained through appropriate fabrication of suitable high aspect-ratio structures 106 in the one or more areas of the first portion 102 of the heat spreader 100.

Further, the second portion 104 of the heat spreader 100 may remain generally solid and substantially flat to facilitate mounting of the at least one device 108 and removal of thermal energy from the at least one device 108. Each device 108 may have a CTE much closer to that of CVD diamond, such as when each device 108 has a CTE of about 3 ppm/K. This mismatch can often be accommodated through the use of the thermal interface material 112 or other mechanisms. As a result, the second portion 104 of the heat spreader 100 can effectively remove thermal energy from the one or more devices 108 while any CTE mismatches are accommodated.

In addition, the optional use of doping may help to facilitate easier fabrication of the heat spreader 100 and/or improved operation of the heat spreader 100. For example, as noted above, boron-doped CVD diamond can be grown much faster than pure CVD diamond and may be substantially easier to etch, thereby facilitating easier formation of the high aspect-ratio structures 106. As another example, doping may be used to create a gradient or otherwise achieve a desired thermal conductivity of the first portion 102 of the heat spreader 100.

Finally, even with the presence of the high aspect-ratio structures 106, the thermal conductivity of the first portion 102 of the heat spreader 100 can still be adequately high and possibly much higher than the thermal conductivity of the device(s) 108. This is useful since the gaps between the high aspect-ratio structures 106 reduce the thermal conductivity of the first portion 102 of the heat spreader 100 relative to the thermal conductivity of the second portion 104 of the heat spreader 100. Thus, even the lower thermal conductivity of the first portion 102 of the heat spreader 100 is still adequate to transfer thermal energy in a suitable manner between the device(s) 108 and the substrate(s) 110.

Although FIG. 1 illustrates one example of a selectively-pliable CVD diamond or other heat spreader 100, various changes may be made to FIG. 1. For example, each component of the heat spreader 100 may have any suitable size, shape, and dimensions and may be formed from any suitable material(s) and in any suitable manner. Also, while specific examples of materials, fabrication techniques, and thermal conductivities are provided above, these are for illustration only and do not limit the scope of this disclosure to these specific materials, fabrication techniques, and thermal conductivities. As a particular example, while often described as involving the use of a diamond material formed by CVD, the diamond material can be formed in any other suitable manner. Also, the heat spreader 100 need not be formed using a diamond material and may be formed using other etchable, high thermal conductivity spreader material(s), such as silicon carbide or aluminum nitride (AlN). As another particular example, while often described as involving the use of a boron-doped diamond material, the diamond material may have any other suitable dopant(s) that facilitate etching, growth, or other formation of the high aspect-ratio structures 106 or the heat spreader 100, or no doping may be used with the diamond material.

Figure 2:
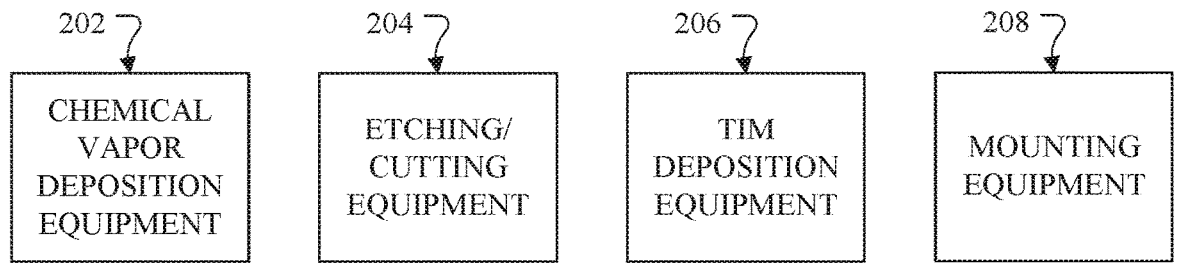
FIG. 2 illustrates an example system for forming a selectively-pliable CVD diamond or other heat spreader in accordance with this disclosure.

FIG. 2 illustrates an example system 200 for forming a selectively-pliable CVD diamond or other heat spreader in accordance with this disclosure. For ease of explanation, the system 200 of FIG. 2 may be described as being used to fabricate one or more instances of the heat spreader 100 of FIG. 1. However, the heat spreader 100 of FIG. 1 may be fabricated in any other suitable manner using any other suitable system. Also, the system 200 of FIG. 2 may be used to fabricate any other suitable heat spreader that is designed in accordance with the teachings of this disclosure.

As shown in FIG. 2, the system 200 includes CVD equipment 202, etching/cutting equipment 204, TIM deposition equipment 206, and mounting equipment 208. The CVD equipment 202 generally represents at least one deposition chamber and related equipment used to perform one or more chemical vapor deposition processes within the deposition chamber(s). Among other things, the CVD equipment 202 can be used to form boron-doped CVD diamond material or other diamond material for use in fabricating heat spreaders. As a particular example, the CVD equipment 202 can be used to form wafers of boron-doped CVD diamond material or other diamond material. In some instances, each wafer of diamond material may be produced by growing the diamond material on a sacrificial substrate and then etching or otherwise removing the sacrificial substrate to obtain the wafer of diamond material. As noted above, in some cases, the diamond material produced by the CVD equipment 202 may be polycrystalline. Also, as noted above, the diamond material produced by the CVD equipment 202 may possibly be doped, with or without a gradient, which can be accomplished by introducing a suitable dopant or dopants into a deposition chamber during growth of the diamond material. The CVD equipment 202 includes any suitable components used to form diamond material or other heat spreader material using a chemical vapor deposition process.

The etching/cutting equipment 204 generally represents equipment used to etch and/or cut the diamond material produced by the CVD equipment 202. For example, the etching/cutting equipment 204 may include at least one etching chamber and related equipment used to perform a deep reactive ion etch process or other plasma etching process on wafers of diamond material to form the high aspect-ratio structures 106. The etching/cutting equipment 204 may alternatively include equipment used to perform a water jet etching process or other suitable etching process that removes material from the wafer of diamond material to form the high aspect-ratio structures 106. As noted above, the formation of the high aspect-ratio structures 106 can be tailored to achieve the desired level of pliability in a heat spreader 100. Different areas of the first portion 102 of the same heat spreader 100 may or may not have high aspect-ratio structures 106 with different characteristics in order to achieve different pliability in those areas. If multiple heat spreaders 100 can be fabricated at different portions of a single wafer of diamond material, the etching/cutting equipment 204 may further include equipment used to cut the wafer of diamond material into separate heat spreaders 100. The etching/cutting equipment 204 includes any suitable components used to etch, cut, or otherwise mechanically process diamond material or other heat spreader material to form high aspect-ratio structures 106 and (if necessary) individuated heat spreaders 100.

The TIM deposition equipment 206 generally represents equipment used to deposit one or more thermal interface materials on heat spreaders 100 and/or on components to be coupled to the heat spreaders 100. For example, the TIM deposition equipment 206 may include equipment used to deposit the thermal interface material 112 on a generally flat surface of the second portion 104 of a heat spreader 100 and to deposit the thermal interface material 114 on a generally flat surface of a substrate 110 to be coupled to the first portion 102 of the heat spreader 100. Note that the placement of the thermal interface materials 112, 114 can vary depending on the implementation and may be deposited in any other suitable manner. The TIM deposition equipment 206 includes any suitable components used to deposit one or more thermal interface materials.

The mounting equipment 208 generally represents equipment used to couple heat spreaders 100 to other components of larger systems. For example, the mounting equipment 208 may include equipment used to mount one or more devices 108 to at least one heat spreader 100 and to mount one or more heat spreaders 100 to at least one substrate 110. In some cases, the mounting equipment 208 may heat one or more of these components to "reflow" solder or other material forming the thermal interface materials 112, 114 in order to couple each heat spreader 100 to the device(s) 108 and the substrate(s) 110. The mounting equipment 208 includes any suitable components used to couple components to heat spreaders 100.

Although FIG. 2 illustrates one example of a system 200 for forming a selectively-pliable CVD diamond or other heat spreader 100, various changes may be made to FIG. 2. For example, various components shown in FIG. 2 may be combined, further subdivided, replicated, omitted, or rearranged and additional components may be added according to particular needs. As a particular example, additional equipment may be used to perform additional operations in the system 200, such as any post-formation processing of the diamond material and/or any post-mounting processing of the mounted heat spreaders/devices/substrates. As another particular example, the general order of the operations discussed above is for illustration only and can vary depending on the equipment being used.

Figure 3:
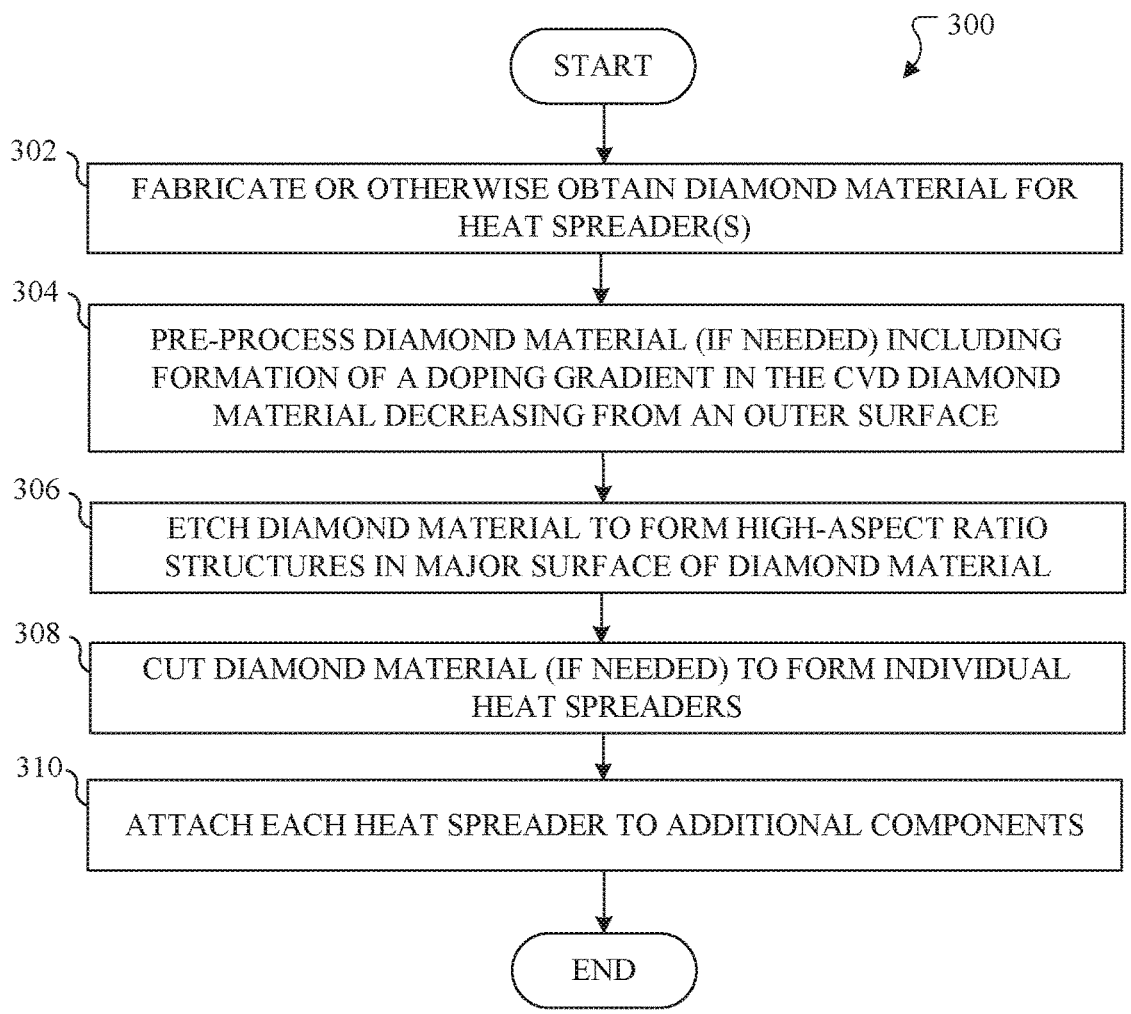
FIG. 3 illustrates an example method for forming a selectively-pliable CVD diamond or other heat spreader in accordance with this disclosure.

FIG. 3 illustrates an example method 300 for forming a selectively-pliable CVD diamond or other heat spreader in accordance with this disclosure. For ease of explanation, the method 300 of FIG. 3 may be described as being used to fabricate one or more instances of the heat spreader 100 of FIG. 1. However, the heat spreader 100 of FIG. 1 may be fabricated in any other suitable manner using any other suitable technique. Also, the method 300 of FIG. 3 may be used to fabricate any other suitable heat spreader that is designed in accordance with the teachings of this disclosure.

As shown in FIG. 3, diamond material for one or more heat spreaders is fabricated or otherwise obtained at step 302. This may include, for example, fabricating or otherwise obtaining at least one wafer of CVD diamond material. Fabrication of the CVD diamond material may involve growth of the CVD diamond material to form one or more wafers, possibly with the introduction of a suitable dopant or dopants at one or more suitable times during the growth (and optionally with the formation of a doping gradient in the CVD diamond material). If necessary, one or more pre-processing operations may be performed on the diamond material at step 304. This may include, for example, pre-processing the wafers of the CVD diamond material so that the diamond material has a desired thickness or other characteristic(s).

The diamond material is etched or otherwise processed to form high-aspect ratio structures in a major surface of the diamond material at step 306. This may include, for example, etching each wafer of CVD diamond material to form the desired high-aspect ratio structures 106 along one major surface of the diamond material. The opposing major surface of the diamond material may remain flat or unetched. As noted above, the characteristics of the high aspect-ratio structures 106 (such as their height, width, or density) can be tailored to achieve the desired level of pliability in a heat spreader 100. Also, the first portion 102 of a single heat spreader 100 may include different areas with high aspect-ratio structures 106 having different characteristics (such as different heights, widths, or densities) in order to obtain different levels of pliability in those areas. Thus, the pliable nature of a heat spreader 100 may be tailored based on a number of factors to achieve constant or variable pliability. The diamond material is cut (if needed) to form individual heat spreaders at step 308. This may include, for example, cutting each wafer of CVD diamond material to form separate heat spreaders 100.

Each heat spreader is attached to additional components at step 310. This may include, for example, coupling each heat spreader 100 (such as the second portion 104 of the heat spreader 100) to one or more devices 108 using a thermal interface material 112 or other mechanism. This may also include coupling each heat spreader 100 (such as the first portion 102 of the heat spreader 100) to at least one substrate 110 using a thermal interface material 114 or other mechanism. Note that these couplings may be accomplished in any other suitable manner and do not need to rely on the use of the thermal interface materials 112, 114.

Although FIG. 3 illustrates one example of a method 300 for forming a selectively-pliable CVD diamond or other heat spreader 100, various changes may be made to FIG. 3. For example, while shown as a series of steps, various steps in FIG. 3 may overlap, occur in parallel, occur in a different order, or occur any number of times.

Figure 4:
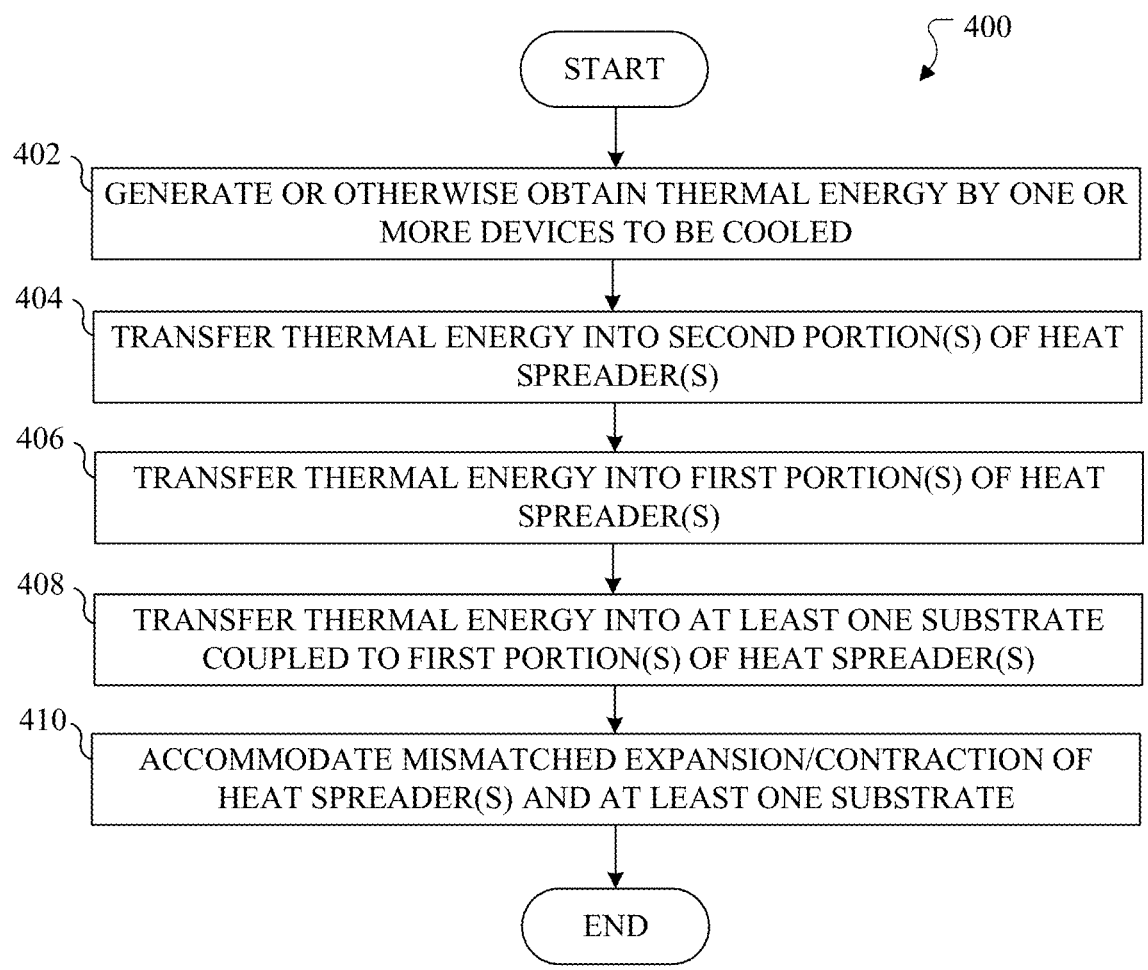
FIG. 4 illustrates an example method for using a selectively-pliable CVD diamond or other heat spreader in accordance with this disclosure.

FIG. 4 illustrates an example method 400 for using a selectively-pliable CVD diamond or other heat spreader in accordance with this disclosure. For ease of explanation, the method 400 of FIG. 4 may be described as involving the use of one or more instances of the heat spreader 100 of FIG. 1. However, the heat spreader 100 of FIG. 1 may be used in any other suitable manner. Also, the method 400 of FIG. 4 may involve the use of any other suitable heat spreader that is designed in accordance with the teachings of this disclosure.

As shown in FIG. 4, thermal energy is generated or otherwise obtained by one or more devices to be cooled at step 402. This may include, for example, operating one or more devices 108 coupled to at least one heat spreader 100. As a particular example, this may include operating one or more power amplifiers or one or more RF modules coupled to at least one heat spreader 100.

At least a portion of the thermal energy is transferred from the one or more devices to be cooled into the second portion of at least one heat spreader at step 404. This may include, for example, thermal energy flowing from the one or more devices 108 into the second portion 104 of the at least one heat spreader 100 through the thermal interface material 112. In some embodiments, the second portion 104 of the at least one heat spreader 100 is unetched or otherwise provides a flat surface, which may help to increase the flow of thermal energy into the heat spreader(s) 100.

At least a portion of the thermal energy is transferred from the second portion of the at least one heat spreader into the first portion of the at least one heat spreader at step 406. This may include, for example, thermal energy flowing from the second portion 104 of the at least one heat spreader 100 into the first portion 102 of the at least one heat spreader 100. Although the first portion 102 of the at least one heat spreader 100 includes high aspect-ratio structures 106 separated by gaps (and therefore has a lower thermal conductivity relative to the second portion 104 of the at least one heat spreader 100), the overall thermal conductivity of the at least one heat spreader 100 can still be more than adequate to transfer a significant amount of thermal energy from the one or more devices 108.

At least a portion of the thermal energy is transferred from the first portion of the at least one heat spreader into at least one substrate at step 408. This may include, for example, thermal energy flowing from the first portion 102 of the at least one heat spreader 100 into one or more substrates 110 through the thermal interface material 114. The overall result of steps 402-408 here is that the one or more devices 108 are cooled based on thermal energy transfer that occurs through the at least one heat spreader 100 and into the substrate(s) 110.

Mismatched thermal expansion and/or contraction of the at least one heat spreader and the at least one substrate is accommodated at step 410. This may include, for example, the high aspect-ratio structures 106 of the first portion 102 of the at least one heat spreader 100 bending or otherwise deforming during operation of the one or more devices 108. This allows copper or other material in the at least one substrate 110 to expand or contract at a different rate than the diamond material in the at least one heat spreader 100. As a result, this helps to avoid the creation of significant stresses along the boundary between the at least one substrate 110 and the at least one heat spreader 100.

Although FIG. 4 illustrates one example of a method 400 for using a selectively-pliable CVD diamond or other heat spreader 100, various changes may be made to FIG. 4. For example, while shown as a series of steps, various steps in FIG. 4 may overlap, occur in parallel, occur in a different order, or occur any number of times.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a heat spreader comprising:
      a first portion configured to be coupled to a substrate, the first portion comprising chemical vapor deposition (CVD) diamond, wherein the CVD diamond in the first portion is doped, and wherein doping in the first portion of the CVD diamond has a gradient, and
      a second portion configured to be coupled to at least one device to be cooled;
   wherein the first portion of the heat spreader comprises high aspect-ratio structures that are separated from one another, the high aspect-ratio structures having heights substantially larger compared to their widths, the high aspect-ratio structures causing the first portion of the heat spreader to be pliable and able to accommodate a mismatch in coefficients of thermal expansion between a material in the heat spreader and a material in the substrate.

2. The apparatus of claim 1, wherein the second portion of the heat spreader comprises CVD diamond.

3. The apparatus of claim 1, wherein the doping in the CVD diamond in the first portion of the heat spreader is greatest along an outer surface of the heat spreader adjacent to the substrate and decreases moving away from the outer surface.

4. The apparatus of claim 1, wherein the CVD diamond in the first portion of the heat spreader is doped with boron.

5. The apparatus of claim 1, wherein the CVD diamond comprises CVD polycrystalline diamond.

6. The apparatus of claim 1, further comprising at least one of:
   a first thermal interface material on an outer surface of the first portion of the heat spreader; and
   a second thermal interface material on an outer surface of the second portion of the heat spreader.

7. A system comprising:
   at least one component configured to generate thermal energy;
   a heat spreader configured to remove thermal energy from the at least one component; and
   at least one substrate configured to remove thermal energy from the heat spreader;
   wherein the heat spreader comprises:
      a first portion coupled to the at least one substrate, the first portion comprising chemical vapor deposition (CVD) diamond, wherein the CVD diamond in the first portion is doped, and wherein doping in the first portion of the CVD diamond has a gradient, and
      a second portion coupled to the at least one component; and
   wherein the first portion of the heat spreader comprises high aspect-ratio structures that are separated from one another, the high aspect-ratio structures having heights substantially larger compared to their widths, the high aspect-ratio structures causing the first portion of the heat spreader to be pliable and able to accommodate a mismatch in coefficients of thermal expansion between a material in the heat spreader and a material in the at least one substrate.

8. The system of claim 7, wherein the at least one component comprises at least one integrated circuit chip.

9. The system of claim 7, wherein at least one of:
   the at least one component comprises a gallium nitride-on-silicon carbide device; and
   the at least one substrate comprises copper.

10. The system of claim 7, wherein the second portion of the heat spreader comprises CVD diamond.

11. The system of claim 7, wherein the heat spreader further comprises at least one of:
   a first thermal interface material on an outer surface of the first portion of the heat spreader; and a second thermal interface material on an outer surface of the second portion of the heat spreader.

12. The system of claim 7, wherein the doping in the CVD diamond in the first portion of the heat spreader is greatest along an outer surface of the heat spreader adjacent to the at least one substrate and decreases moving away from the outer surface.

13. The system of claim 7, wherein the CVD diamond in the first portion of the heat spreader is doped with boron.

14. The system of claim 7, wherein the CVD diamond comprises CVD polycrystalline diamond.

15. A method comprising:
obtaining a heat spreader comprising:
a first portion comprising chemical vapor deposition (CVD) diamond, wherein the CVD diamond in the first portion is doped, and wherein doping in the first portion of the CVD diamond has a gradient, and
a second portion;
attaching the first portion of the heat spreader to a substrate; and
attaching the second portion of the heat spreader to at least one device to be cooled;
wherein the first portion of the heat spreader comprises high aspect-ratio structures that are separated from one another, the high aspect-ratio structures having heights substantially larger compared to their widths, the high aspect-ratio structures causing the first portion of the heat spreader to be pliable and able to accommodate a mismatch in coefficients of thermal expansion between a material in the heat spreader and a material in the substrate.

16. The method of claim 15, wherein the second portion of the heat spreader comprises CVD diamond.

17. The method of claim 16, wherein obtaining the heat spreader comprises fabricating the heat spreader by:
obtaining a wafer of CVD diamond;
etching the wafer to form the high aspect-ratio structures; and
cutting the wafer to form individual heat spreaders.

18. The method of claim 15, wherein the doping in the CVD diamond in the first portion of the heat spreader is greatest along an outer surface of the heat spreader adjacent to the substrate and decreases moving away from the outer surface.

19. The method of claim 15, wherein the CVD diamond in the first portion of the heat spreader is doped with boron.

20. The method of claim 15, wherein the CVD diamond comprises CVD polycrystalline diamond.

* * * * *